United States Patent
Kuo et al.

(10) Patent No.: US 8,999,184 B2
(45) Date of Patent: Apr. 7, 2015

(54) METHOD FOR PROVIDING VIAS

(75) Inventors: Ming-Shu Kuo, San Ramon, CA (US); Siyi Li, Fremont, CA (US); Yifeng Zhou, Fremont, CA (US); Ratndeep Srivastava, Sunnyvale, CA (US); Tae Won Kim, Dublin, CA (US); Gowri Kamarthy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/566,934

(22) Filed: Aug. 3, 2012

(65) Prior Publication Data

US 2014/0038419 A1    Feb. 6, 2014

(51) Int. Cl.
- *B44C 1/22* (2006.01)
- *H01J 37/32* (2006.01)
- *H01L 21/033* (2006.01)
- *H01L 21/311* (2006.01)
- *H01L 21/768* (2006.01)

(52) U.S. Cl.
CPC ........... *H01L 21/0338* (2013.01); *H01J 37/321* (2013.01); *H01J 2237/334* (2013.01); *H01L 21/31116* (2013.01); *H01L 21/31138* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 6,811,956 B1 | 11/2004 | Gabriel | |
| 7,053,003 B2 | 5/2006 | Kanarik et al. | |
| 7,202,176 B1 * | 4/2007 | Goto et al. | 438/706 |
| 2002/0139775 A1 * | 10/2002 | Chang et al. | 216/67 |
| 2003/0158058 A1 * | 8/2003 | Yoon et al. | 510/175 |
| 2006/0094221 A1 | 5/2006 | Soda et al. | |
| 2007/0095787 A1 * | 5/2007 | Mezzapelle | 216/58 |
| 2009/0291562 A1 * | 11/2009 | Jensen | 438/710 |
| 2010/0015809 A1 | 1/2010 | Adams et al. | |

OTHER PUBLICATIONS

Weng, Integrated process feasibility of hard-mask for tight pitch rinterconnects fabrication,2011, The society for experimental mechanics, p. 1-7.*

Silex, Silex Ready for Functional Capping of MEMs and CMOS, Apr. 8, 2009, I-Micronews, p. 1-2.*

* cited by examiner

*Primary Examiner* — Binh X Tran
*Assistant Examiner* — David Cathey, Jr.
(74) *Attorney, Agent, or Firm* — Beyer Law Group LLP

(57) ABSTRACT

A method for forming via holes in an etch layer disposed below a patterned organic mask with a plurality of patterned via holes is provided. The patterned organic mask is treated by flowing a treatment gas comprising $H_2$. A plasma is formed from the treatment gas. The patterned via holes are rounded to form patterned rounded via holes by exposing the patterned via holes to the plasma. The flow of the treatment gas is stopped. The plurality of patterned rounded via holes are transferred into the etch layer.

13 Claims, 9 Drawing Sheets

METHOD FOR PROVIDING VIAS

BACKGROUND OF THE INVENTION

Field of the Invention

The invention relates to a method of forming semiconductor devices on a semiconductor wafer. More specifically, the invention relates to etching vias in an etch layer.

In forming semiconductor devices, some devices may be formed by etching vias in an etch layer.

SUMMARY OF THE INVENTION

To achieve the foregoing and in accordance with the purpose of the present invention, a method for forming via holes in an etch layer disposed below a patterned organic mask with a plurality of patterned via holes is provided. The patterned organic mask is treated by flowing a treatment gas comprising $H_2$. A plasma is formed from the treatment gas. The patterned via holes are rounded to form patterned rounded via holes by exposing the patterned via holes to the plasma. The flow of the treatment gas is stopped. The plurality of patterned rounded via holes are transferred into the etch layer.

In another manifestation of the invention a method for forming via holes in an etch layer disposed below a patterned organic mask with a plurality of patterned via holes is provided. The patterned organic mask is treated, comprising flowing a treatment gas comprising $H_2$, forming a plasma from the treatment gas, rounding the patterned via holes to form patterned rounded via holes by exposing the patterned via holes to the plasma, and stopping the flow of the treatment gas. The plurality of patterned rounded via holes are transferred into the etch layer. Features are opened in a silicon containing mask layer below the patterned organic mask using the rounded vias holes in the patterned organic mask, comprising providing an opening gas with an etchant component and polymerizing component, forming the opening gas into a plasma, which etches features through the silicon containing mask layer with a second CD, which is less than half the first CD, forming a pattern in the silicon containing mask layer, transferring the pattern of the silicon containing mask layer to an organic underlayer disposed below the silicon containing mask layer, and transferring a pattern from the organic underlayer to the etch layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Due to lithography resolution limits, etch-introduced critical dimension (CD) shrinkage is required for patterning of vias beyond 20 nm technology. To achieve such dimensions, a shrink process may be required. Even with such a shrink process the lithography mask patterns for forming vias may only be able to provide irregularly shaped patterns instead of smooth rounded circular patterns. The irregularly shaped patterns on lithography mask would be transferred to etch layer and need to be repaired before etch process.

Figure 1:
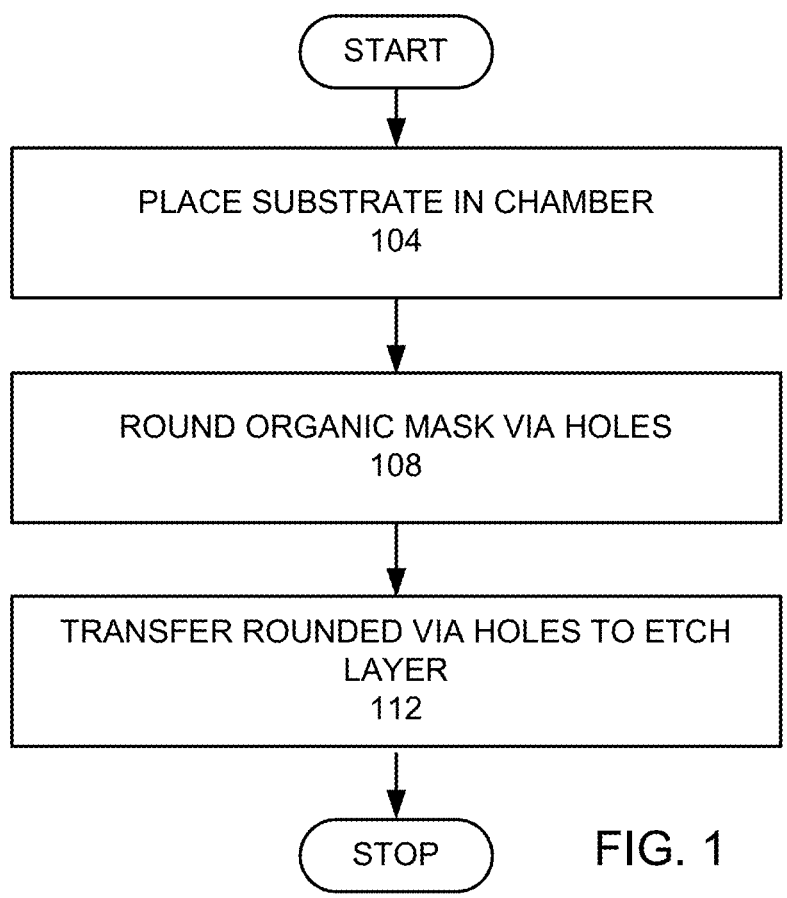
FIG. 1 is a high level flow chart of an embodiment of the invention.

FIG. 1 is a high level flow chart of an embodiment of the invention. In this embodiment, a substrate is placed in an etch chamber (step 104). Preferably, the substrate has an etch layer disposed below a patterned organic mask, such as a photoresist mask, with patterned vias that have an irregular shape. A pre-plasma treatment is used to round the patterned vias to provide rounded vias (step 108). The patterned organic mask with rounded vias is used to etch vias into the etch layer (step 112).

Example

Figure 2A:
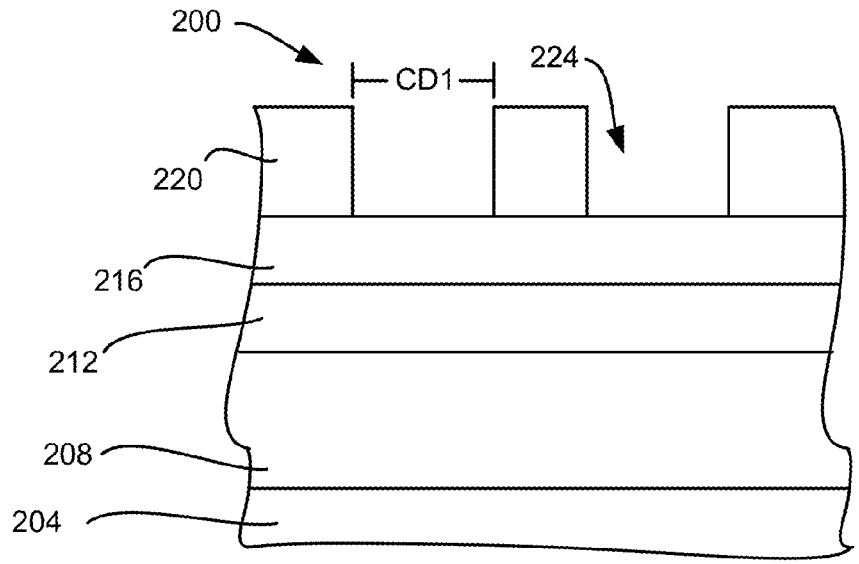
FIGS. 2A-E are schematic cross-sectional views of a stack etch according to an embodiment of the invention.

In a preferred embodiment of the invention, a substrate with an etch layer of silicon oxide disposed under an organic underlayer disposed under a silicon containing antireflective coating (SiARC) disposed below a patterned organic mask of 193 nm photoresist with features with CD greater than 40 nm is placed in an etch chamber (step 104). FIG. 2A is a schematic cross-sectional view of a stack 200 with a substrate 204 with an etch layer 208 disposed below an organic underlayer 212, disposed below a SiARC 216, disposed below a photoresist mask 220 with patterned vias 224 with a CD of greater than 40 nm. In this example, one or more layers may be disposed between the substrate 204 and the etch layer 208, or the etch layer 208 and the organic underlayer 212 or the organic underlayer 212 and the SiARC 216.

Figure 3A:
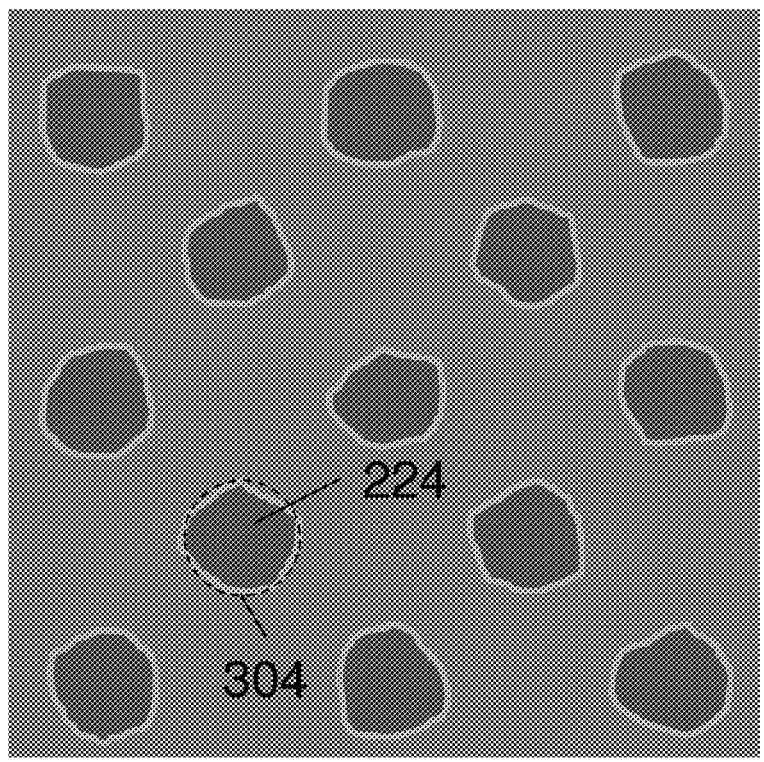
FIGS. 3A-B are schematic illustrations of a top view of photoresist masks during an embodiment of the invention.

FIG. 3A is a schematic illustration of a top view of the photoresist mask 220 provided by a lithographic via forming process. The vias have a mean CD of 60 nm. A dashed circle 304 is placed over one of the patterned vias 224 to show that the patterned vias 224 are irregular since they vary from the dashed circle 304.

Figure 4:
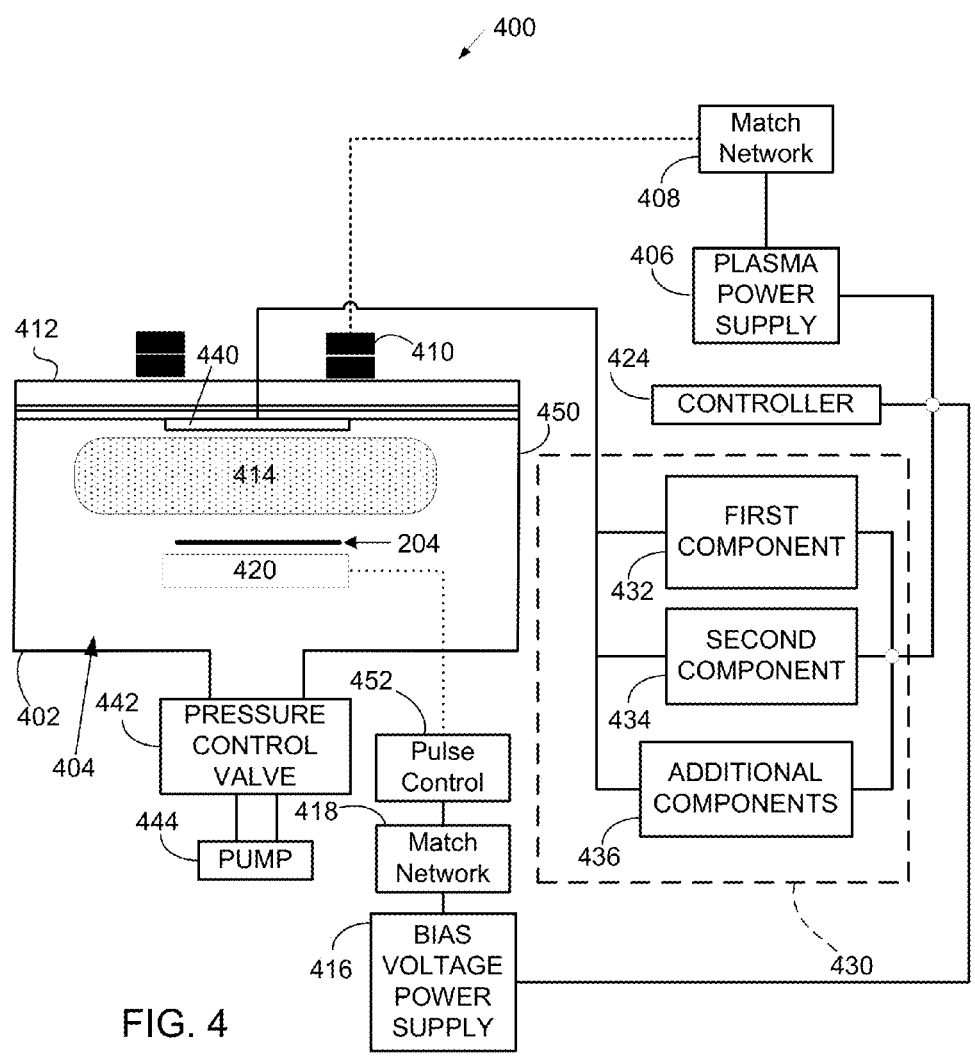
FIG. 4 is a schematic view of a plasma processing chamber that may be used in an embodiment of the invention.

FIG. 4 schematically illustrates an example of a plasma processing system 400 which may be used in one embodiment of the present invention. The plasma processing system 400 includes a plasma reactor 402 having a plasma processing chamber 404 therein defined by a chamber wall 450. A plasma power supply 406, tuned by a match network 408, supplies power to a TCP coil 410 located near a power window 412 that provides power to the plasma processing chamber 404 to create a plasma 414 in the plasma processing chamber 404. The TCP coil (upper power source) 410 may be configured to produce a uniform diffusion profile within processing chamber 404. For example, the TCP coil 410 may be configured to generate a toroidal power distribution in the plasma 414. The power window 412 is provided to separate the TCP coil 410 from the plasma processing chamber 404 while allowing energy to pass from the TCP coil 410 to the plasma chamber 404. A wafer bias voltage power supply 416 tuned by a match network 418 provides power to an electrode 420 to set the bias voltage on the substrate 204, which is supported by the electrode 420, so that the electrode 420 in this embodiment is also a substrate support. A pulse controller 452 causes the bias voltage to be pulsed. The pulse controller 452 may be between the match network 418 and the substrate support, or between the bias voltage power supply 416 and the match network 418, or between the controller 424 and the bias voltage power supply 416, or in some other configuration to cause the bias voltage to be pulsed. A controller 424 sets points for the plasma power supply 406 and the wafer bias voltage supply 416.

The plasma power supply 406 and the wafer bias voltage power supply 416 may be configured to operate at specific radio frequencies such as, for example, 13.56 MHz, 27 MHz, 2 MHz, 400 kHz, or combinations thereof. Plasma power supply 406 and wafer bias power supply 416 may be appropriately sized to supply a range of powers in order to achieve desired process performance. For example, in one embodiment of the present invention, the plasma power supply 406 may supply the power in a range of 500 to 10000 Watts, and the wafer bias voltage power supply 416 may supply a bias voltage in a range of 10 to 2000 V. In addition, the TCP coil 410 and/or the electrode 420 may be comprised of two or more sub-coils or sub-electrodes, which may be powered by a single power supply or powered by multiple power supplies.

As shown in FIG. 4, the plasma processing system 400 further includes a gas source/gas supply mechanism 430. The gas source 430 includes a first component gas source 432, a second component gas source 434, and optionally, additional component gas sources 436. The various component gases will be discussed below. The gas sources 432, 434, and 436 are in fluid connection with process chamber 404 through a gas inlet 440. The gas inlet 440 may be located in any advantageous location in process chamber 404, and may take any form for injecting gas. Preferably however, the gas inlet 440 may be configured to produce a "tunable" gas injection profile, which allows independent adjustment of the respective flow of the gases to multiple zones in the process chamber 404. The process gases and byproducts are removed from the chamber 404 via a pressure control valve 442, which is a pressure regulator, and a pump 444, which also serves to maintain a particular pressure within the plasma process chamber 404 and also provides a gas outlet. The gas source/gas supply mechanism 430 is controlled by the controller 424. A Kiyo system by Lam Research Corporation may be used to practice an embodiment of the invention.

Figure 5:
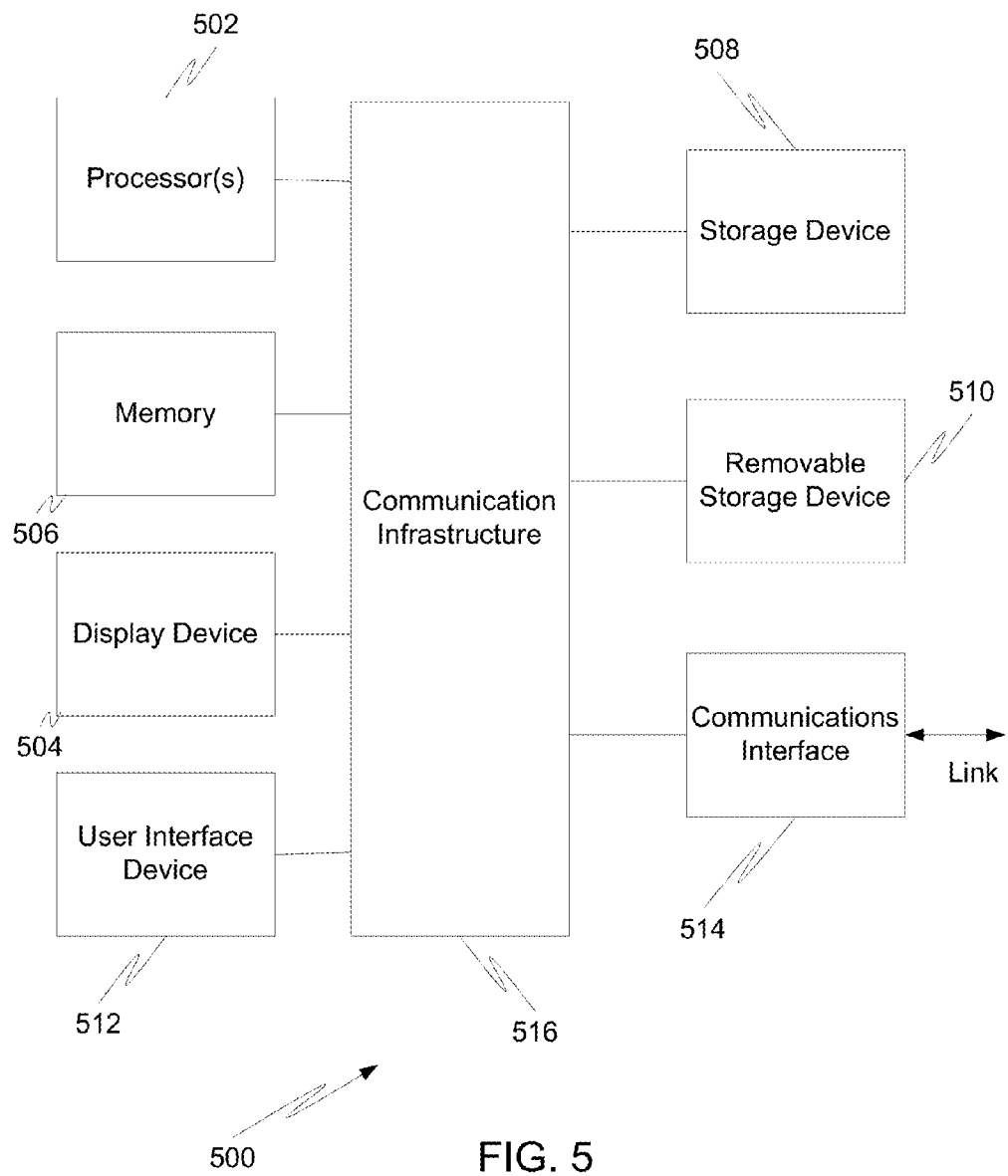
FIG. 5 is a schematic view of a computer system that may be used in practicing the invention.

FIG. 5 is a high level block diagram showing a computer system 500, which is suitable for implementing a controller 424 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6:
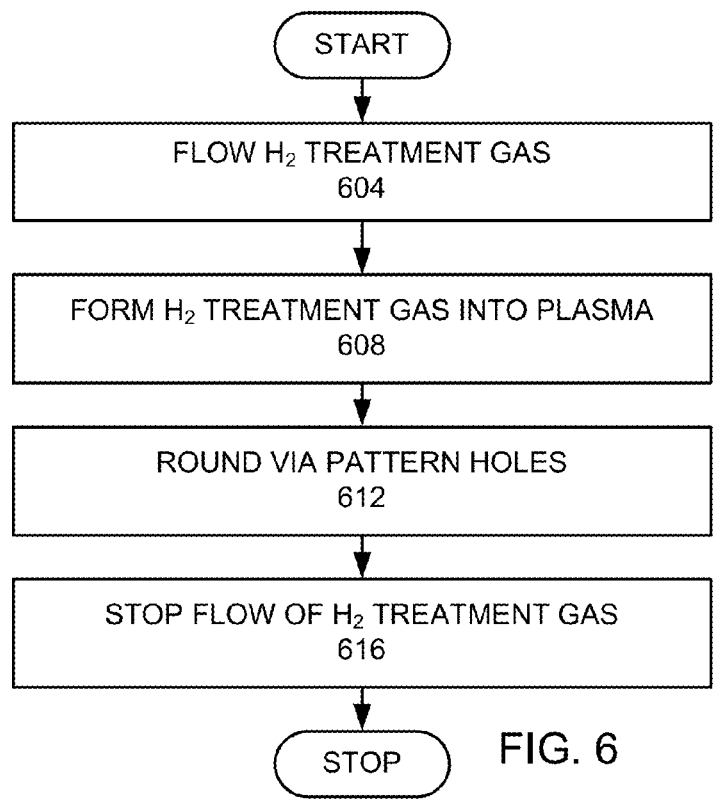
FIG. 6 is a more detailed flow chart of the step of rounding the organic mask via holes.

After the substrate 204 has been placed into the plasma processing chamber 404, the via holes in the organic mask are rounded (step 108). FIG. 6 is a more detailed flow chart of the step of rounding the organic mask via holes. An $H_2$ treatment gas comprising $H_2$ is flowed from the gas source 430 into the plasma processing chamber 404 (step 604). The $H_2$ treatment gas is formed into a plasma (step 608). Exposure of the of the photoresist mask 220 to the $H_2$ treatment plasma causes the mask patterned via holes 224 to shrink and become rounder (step 612). After the rounding process is completed, the process is stopped, which in this example is by stopping the flow of the $H_2$ treatment gas (step 616). Preferably, the $H_2$ treatment comprises $H_2$. More preferably the $H_2$ treatment gas consists essentially of $H_2$ or $H_2$ and an inert diluent, such as He. Most preferably, the $H_2$ treatment gas consists essentially of $H_2$.

Figure 2B:
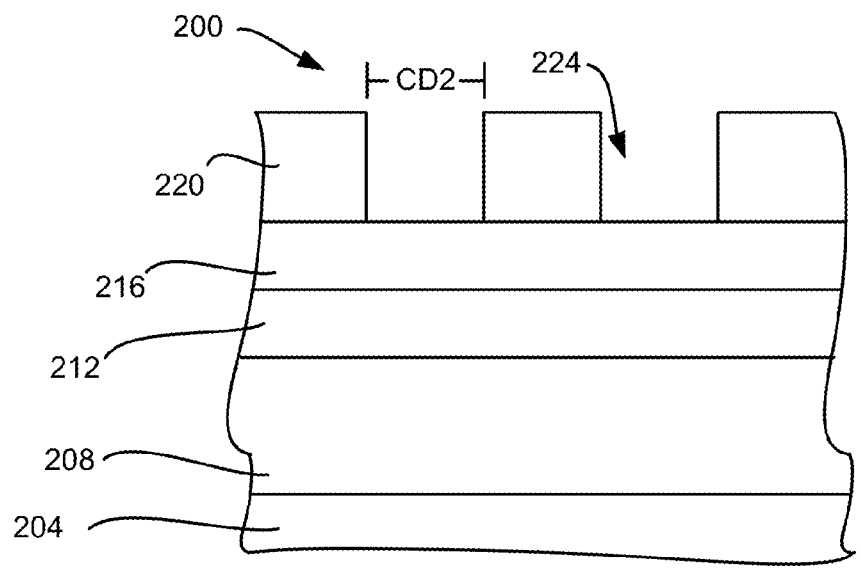

An example of a recipe provides a pressure of 10 mTorr. An $H_2$ treatment gas of 100 sccm $H_2$ and 100 sccm He is flowed from the gas source 430 into the plasma processing chamber 404 (step 604). An RF signal at 900 watts is provided to the plasma processing chamber to form the $H_2$ treatment gas into a plasma (step 608). A temperature is maintained at 10° C. The process is maintained for 6 seconds to round the via pattern holes (step 612), before the flow of the $H_2$ treatment gas is stopped (step 616). There is not bias voltage (i.e. the bias voltage is 0). FIG. 2B is a cross-sectional view of the stack 200 after the vias holes in the organic mask are rounded.

Before the $H_2$ treatment, the vias holes have a CD of CD1, as shown in FIG. 2A. After the $H_2$ treatment, the via holes have a smaller CD of CD2, as shown in FIG. 2B.

Figure 3B:
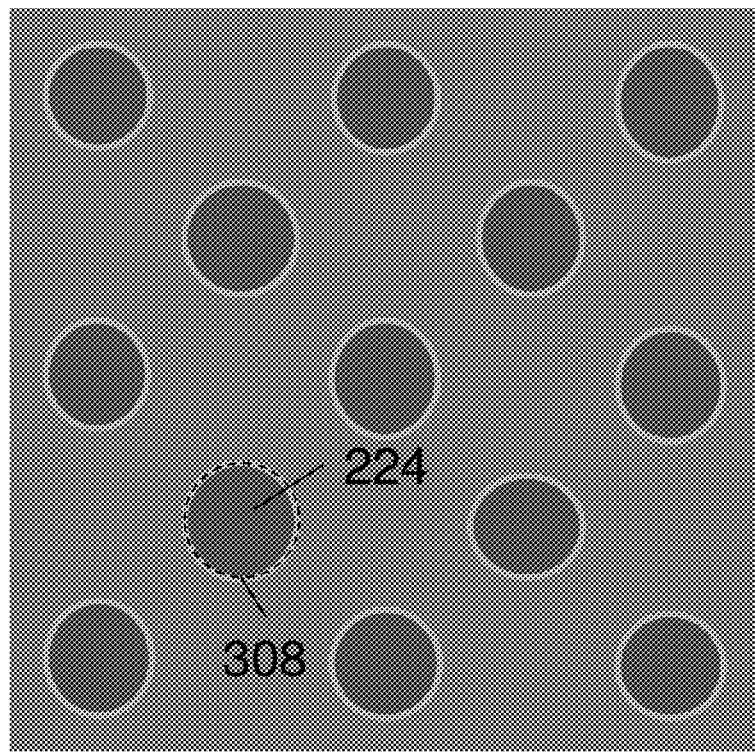

FIG. 3B is a schematic illustration of a top view of the photoresist mask 220 after the vias holes in the organic mask are rounded. The vias have a mean CD of 62 nm. A dashed circle 308 is placed over one of the patterned vias 224 to show that the patterned vias 224 are more rounded, since they are much closer to the shape of the circle 308.

Figure 7:
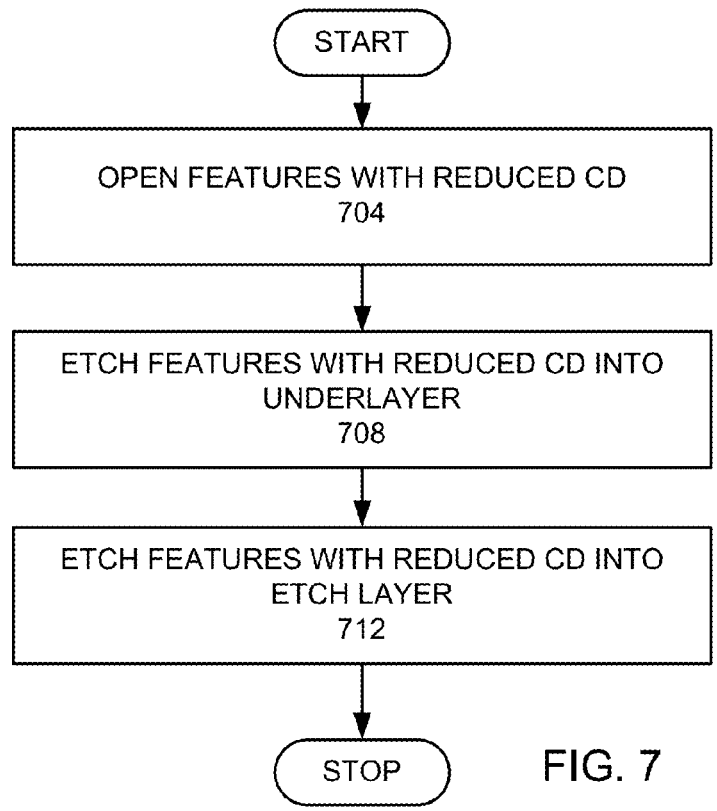
FIG. 7 is a more detailed flow chart of the step of transferring the rounded via holes to the etch layer in an embodiment of the invention.

The plurality of patterned rounded via holes are transferred into the etch layer to form vias in the etch layer (step 112). FIG. 7 is a more detailed flow chart of the step of transferring the rounded via holes to the etch layer in this embodiment of the invention.

Features are opened in the silicon containing mask layer using the patterned organic mask (step 704), where the opened features in the silicon containing layer have a CD less than half the CD of the features in the organic mask. An opening gas is flowed into the etch chamber. In an example of a recipe, the opening gas is 15 sccm $C_4F_8$, 60 sccm $CF_4$, 80 sccm $N_2$, and 50 sccm He. The pressure is maintained at 12 mTorr. The opening gas is formed into a plasma. 600 watts of RF is provided by the TCP coil to form the opening gas into a plasma. The bias voltage is 195 volts at an RF frequency of 13.56 MHz. The process is maintained for 48 seconds. The opening process is then stopped.

Figure 2C:
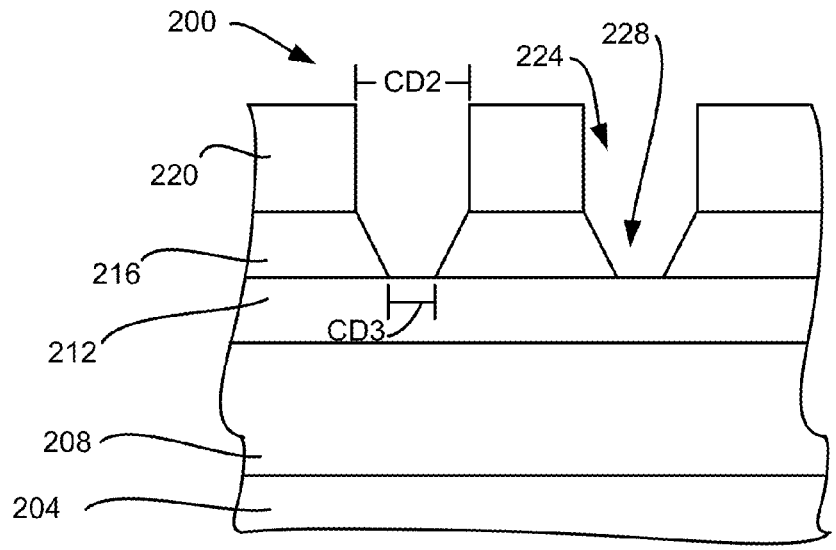

FIG. 2C is a schematic cross-sectional view of the stack 200 after features 228 are opened in the silicon containing mask layer (SiARC) 216 using the photoresist mask 220. In this example, the CD (CD2) of the photoresist via holes is at least 40 nm and the CD (CD3) at the bottom of the features 228 of the silicon containing mask layer 216 is no more than 18 nm, so that the CD at the bottom of the features of the silicon containing mask layer 216 is less than half the CD of the photoresist features.

Using the features with reduced CD in the silicon containing layer as a mask, features with reduced CD are etched into the organic underlayer (step 708). An example of a recipe for etching the organic underlayer provides a pressure of 5 mTorr. An etch gas is flowed into the chamber, comprising 20 sccm $Cl_2$, 50 sccm HBr, 90 sccm $O_2$, and 50 sccm $N_2$. The etch gas is formed into a plasma by providing 300 watts TCP power. A bias of 250 volts is provided. The process is maintained for 45 seconds.

Figure 2D:
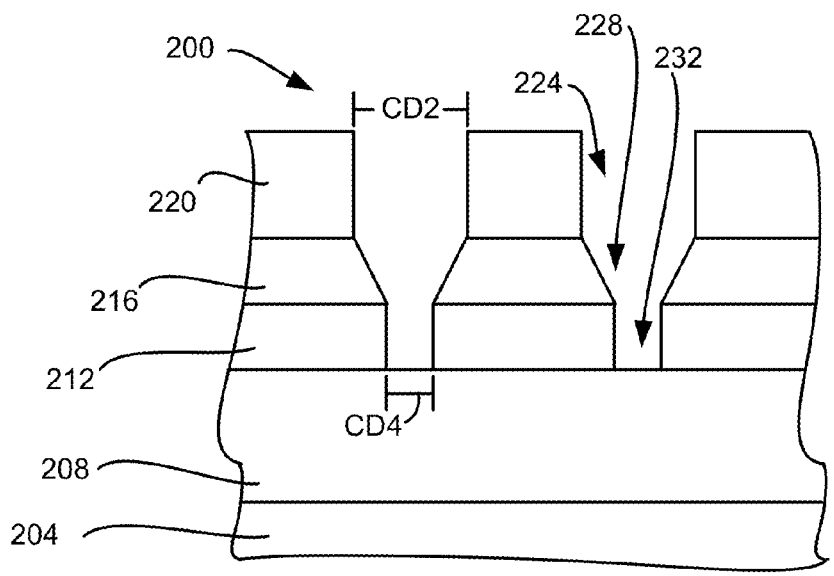

FIG. 2D is a schematic cross-sectional view of the stack 200 after the features 232 with reduced CD are etched into the organic underlayer 212. In this example, the CD (CD2) of the photoresist features is at least 40 nm and the CD (CD4) of the features 232 of the organic underlayer 212 is no more than 18 nm, so that the CD (CD4) of the features of the organic underlayer 212 is less than half the CD (CD1) of the patterned vias 224 of the photoresist mask 220 before the $H_2$ treatment. In some embodiments, the photoresist mask 220 may be partially or completely removed during etching of the organic underlayer or opening the silicon containing mask layer, however, the photoresist mask 220 is shown to show CD2.

The reduced CD features in the organic underlayer 212 are used to etch reduced CD features into the etch layer 208 (step 712), where the reduced CD features have a CD less than half the CD of the features in the organic mask.

In an example of a recipe for etching the etch layer 212, which in this embodiment is silicon oxide, a pressure of 3 mTorr is provided. An etching gas comprising 90 sccm $CF_4$ and 45 sccm $CHF_3$ is flowed into the chamber. The etch gas is formed into a plasma by providing 600 watts TCP power. A bias voltage is of 160 volts is provided. The process is maintained for 42 seconds.

Figure 2E:
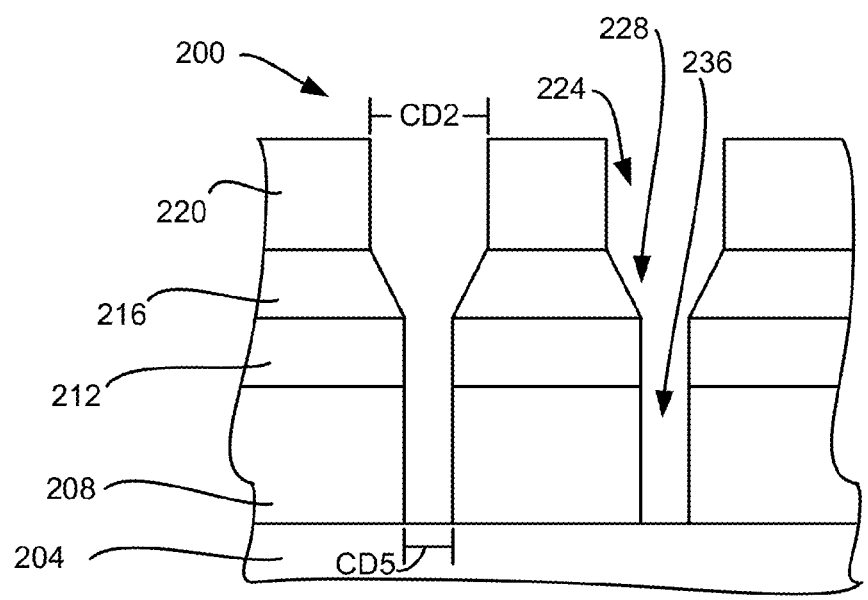

FIG. 2E is a schematic cross-sectional view of the stack 200 after the features 236 with reduced CD are etched into the etch layer 208. In this example, the CD (CD2) of the photoresist features is at least 40 nm, and the CD (CD5) of the features 236 of the etch layer 208 is no more than 18 nm, so that the CD (CD5) of the features of the etch layer 208 is less than half the CD (CD1) of the patterned vias 224 of the photoresist mask 220 before $H_2$ treatment. In some embodiments, the photoresist mask 220 may be partially or completely removed during opening the silicon containing mask layer or etching of the organic underlayer or etching the etch layer, however, the photoresist mask 220 is shown to show CD2.

Current conventional lithography provides photoresist features with CD of around 40 nm or 60 nm. Via patterns using such processes provide irregularly shaped via features. Embodiments of the invention allow such photoresist features to provide etch layer features as low as 12 nm to 18 nm with rounded via holes. Some embodiments of the invention provide a shrink so that the shrunk CD is less than one third the original CD, which, for example, may shrink a 60 nm photoresist mask feature to 18 nm at the bottom of the silicon containing mask layer.

Without being bound by theory, it is believed that the off part of the duty cycle of the bias pulsing causes a net polymer deposition, which causes the tapering, while the on part of the duty cycle of the bias pulsing cause a net removal of the polymer deposition or a reduced polymer deposition. The longer the percentage that the duty cycle is off, the more the taper of the etch. As a result, the duty cycle may be used as a control of the etch taper, with an increase in the off duty cycle causing an increase in the taper.

Figure 8A:
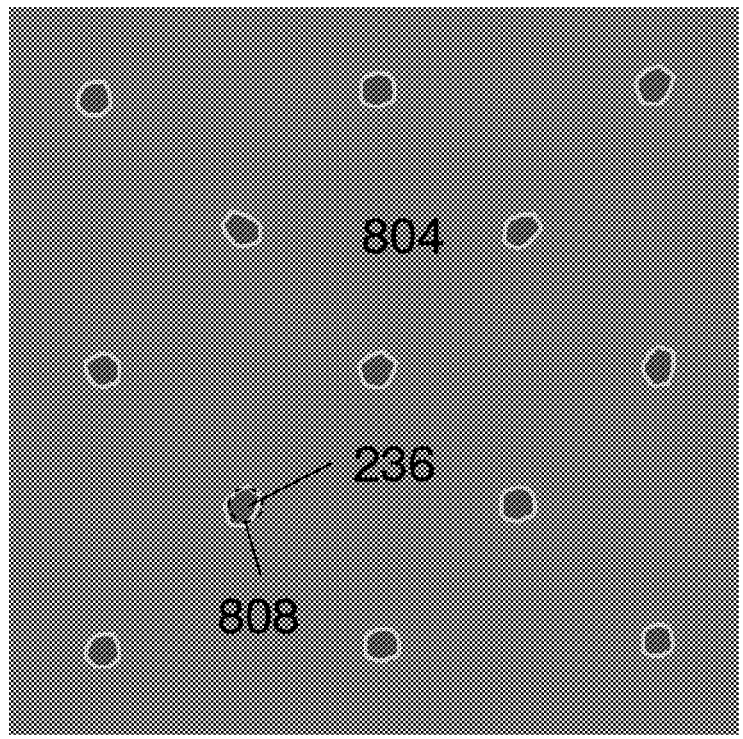
FIG. 8A is a schematic illustration of a top view of an etch layer with via holes, where an $H_2$ treatment was not provided.
Figure 8B:
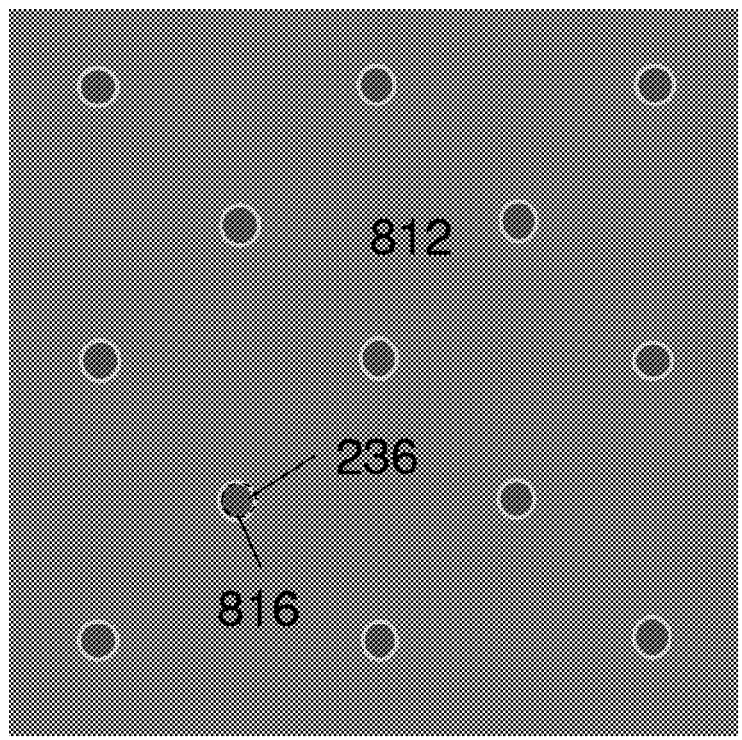
FIG. 8B is a schematic illustration of a top view of an etch layer with via holes, where an $H_2$ treatment was provided.

The $H_2$ treatment has been found to provide rounder via holes. FIG. 8A is a schematic illustration of a top view of an etch layer 804 with via holes 236, where an $H_2$ treatment was not provided. The mean CD of the via holes was measured as 17 nm. A dashed circle 808 is placed over one of the patterned vias 236 to show that the patterned vias 236 are irregular since they vary from the dashed circle 808. FIG. 8B is a schematic illustration of a top view of an etch layer 812 with via holes 236, where an $H_2$ treatment was provided. The mean CD of the via holes was measured as 17 nm. A dashed circle 816 is placed over one of the patterned vias 236 to show that the patterned vias 236 are more rounded, since they are much closer to the shape of the circle 816. The improvement in lithography mask via hole shape by H2 PPT can be transferred to the shape of via holes in etch layer.

Preferably, the $H_2$ treatment does not etch or strip the organic mask or an underlying layer. Therefore, no or a low bias is used during the $H_2$ treatment. Preferably, the bias is between 0 to 100 volts. More preferably, the bias is between 0 to 50 volts. Most preferably, the bias is 0 volts. In addition, a low power, such as less than 1500 watts is used for forming the plasma during the $H_2$ treatment.

Preferably, the etch layer is a dielectric layer. Preferably, the $H_2$ treatment gas is halogen free. Preferably, the $H_2$ treatment comprises $H_2$. More preferably, the $H_2$ treatment gas consists essentially of $H_2$ or $H_2$ and an inert diluent, such as He. Most preferably, the $H_2$ treatment gas consists essentially of $H_2$.

Preferably, the $H_2$ treatment and the steps for transferring the via patterns from the organic mask into the etch layer are done in situ in the same chamber. Since the $H_2$ treatment and subsequent pattern transfer steps are performed using a dry process using a plasma, all of the processes may be performed in the same plasma processing chamber.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for forming via holes in an etch layer disposed below a patterned organic mask with a plurality of patterned via holes, comprising:
    treating the patterned organic mask, comprising:
        flowing a treatment gas comprising $H_2$;
        forming a plasma from the treatment gas;
        rounding the patterned via holes to form patterned rounded via holes by exposing the patterned via holes to the plasma; and
        stopping the flow of the treatment gas; and
    transferring the plurality of patterned rounded via holes into the etch layer, comprising:
        opening features in a silicon containing mask layer below the patterned organic mask using the rounded via holes in the patterned organic mask, comprising:
            providing an opening gas with an etchant component and polymerizing component;
            forming the opening gas into a plasma, which etches features through the silicon containing mask layer with a second critical dimension, which is less than half a first critical dimension, forming a pattern in the silicon containing mask layer;
        transferring the pattern of the silicon containing mask layer to an organic underlayer disposed below the silicon containing mask layer; and
        transferring a pattern from the organic underlayer to the etch layer,
    wherein the forming a plasma uses a bias between 0 to 100 volts.

2. The method, as recited in claim 1, wherein the treatment gas is halogen free.

3. The method, as recited in claim 1, wherein the treatment gas consists essentially of He and $H_2$.

4. The method, as recited in claim 1, wherein the treatment gas consists essentially of $H_2$.

5. The method, as recited in claim 4, wherein the forming a plasma uses no more than 1500 watts of RF power.

6. The method, as recited in claim 1, wherein the forming of a plasma uses a bias of 0 volts.

7. The method, as recited in claim 1, further comprising:
    placing a wafer with the etch layer and patterned organic mask in a process chamber before the treating the patterned organic mask, wherein all of the steps are done in situ; and
    removing the wafer from the process chamber after etching the etch layer.

8. A method for forming via holes in an etch layer disposed below a patterned organic mask with a plurality of patterned via holes, comprising:
    treating the patterned organic mask, comprising:
        flowing a treatment gas comprising $H_2$;
        forming a plasma from the treatment gas;
        rounding the patterned via holes to form patterned rounded via holes by exposing the patterned via holes to the plasma; and
        stopping the flow of the treatment gas; and
    transferring the plurality of patterned rounded via holes into the etch layer, comprising:
        opening features in a silicon containing mask layer below the patterned organic mask using the rounded vias holes in the patterned organic mask, comprising:
            providing an opening gas with an etchant component and polymerizing component;
            forming the opening gas into a plasma, which etches features through the silicon containing mask layer with a second critical dimension, which is less than half a first critical dimension, forming a pattern in the silicon containing mask layer;
        transferring the pattern of the silicon containing mask layer to an organic underlayer disposed below the silicon containing mask layer; and
        transferring a pattern from the organic underlayer to the etch layer.

9. The method, as recited in claim 8, wherein the forming a plasma from the treatment gas uses a bias of less than 50 volts.

10. The method, as recited in claim 9, wherein the treatment gas consists essentially of $H_2$ or He and $H_2$.

11. The method, as recited in claim 8, wherein the treatment gas uses a bias of 0 volts.

12. The method, as recited in claim 8, further comprising:
    placing a wafer with the etch layer and patterned organic mask in a process chamber before the treating the patterned organic mask, wherein all of the steps are done in situ; and
    removing the wafer from the process chamber after etching the etch layer.

13. The method, as recited in claim 8, wherein the forming a plasma uses no more than 1500 watts of RF power.

* * * * *